(12) United States Patent
Uno

(10) Patent No.: US 6,906,653 B2
(45) Date of Patent: Jun. 14, 2005

(54) DIGITAL TO ANALOG CONVERTER WITH A WEIGHTED CAPACITIVE CIRCUIT

(75) Inventor: Masayuki Uno, Ina (JP)

(73) Assignee: Linear Cell Design Co., Ltd., Nagano-Ken (JP)

(*) Notice: Subject to any disclaimer, the term of this patent is extended or adjusted under 35 U.S.C. 154(b) by 0 days.

(21) Appl. No.: 10/410,540

(22) Filed: Apr. 9, 2003

(65) Prior Publication Data

US 2003/0201923 A1 Oct. 30, 2003

Related U.S. Application Data

(63) Continuation-in-part of application No. 09/982,303, filed on Oct. 17, 2001, now Pat. No. 6,611,164.

(30) Foreign Application Priority Data

Oct. 18, 2000 (JP) ........................................ 2000-317998
Apr. 10, 2002 (JP) ........................................ 2002-107583

(51) Int. Cl.$^7$ ................................................ H03M 1/66
(52) U.S. Cl. .................. 341/150; 341/172; 341/131
(58) Field of Search ................................ 341/150, 131, 341/172, 144

(56) References Cited

U.S. PATENT DOCUMENTS

| | | | | |
|---|---|---|---|---|
| 5,376,936 A | * | 12/1994 | Kerth et al. | 341/150 |
| 5,534,863 A | * | 7/1996 | Everitt et al. | 341/150 |
| 5,563,597 A | * | 10/1996 | McCartney | 341/150 |
| 6,081,218 A | * | 6/2000 | Ju et al. | 341/150 |
| 6,259,392 B1 | | 7/2001 | Choi et al. | |
| 6,288,669 B1 | | 9/2001 | Gata | |
| 6,501,409 B1 | * | 12/2002 | Lynn et al. | 341/150 |

FOREIGN PATENT DOCUMENTS

| | | |
|---|---|---|
| EP | 0 522 721 A2 | 1/1993 |
| EP | 0 899 884 A2 | 3/1999 |
| EP | 1 353 445 A3 | 10/2003 |
| JP | 3166603 | 10/1997 |
| JP | 09-275345 | 10/1997 |

OTHER PUBLICATIONS

Alan B. Grebene, Bipolar and MOS Analog Integrated Circuit Design, 1984, p. 761–764, A Wiley–Interscience Publication, Micro–Linear Corporation, Sunnyvale, California.

(Continued)

*Primary Examiner*—Michael Tokar
*Assistant Examiner*—Lam T. Mai
(74) *Attorney, Agent, or Firm*—Cook, Alex, McFarron, Manzo, Cummings & Mehler, Ltd.

(57) ABSTRACT

D/A converter of this invention including n+1 capacitors in total consisting of one terminating capacitor (C0) and n binary-weighted capacitors (C1–4) that are subjected to binary weighting ratio of $1:2:4:\ldots:2^{(n-1)}$, and, an inverting amplifier (INV1), further comprising: a feedback switching means (SWR5) provided between the input and output of the inverting amplifier (INV1); a switching means for terminating operation (SWR0) supplies one of two main reference voltages (VB,VT) to the terminating capacitor (C0), and then, makes connection of the terminating capacitor (C0) to the output of the inverting amplifier (INV1); a plurality of switching means for input operation (SWD1–4,SWR1–4) makes selection of one of the two main reference voltages (VB,VT) to be provided for the n binary-weighted capacitors (C1–4) depending on digital data (D1–4), and then, makes connection of the second terminal side of the n binary-weighted capacitors (C1–4) to the output of the inverting amplifier (INV1).

7 Claims, 11 Drawing Sheets

OTHER PUBLICATIONS

Ichiro Fujimori, Akihiko Nogi, Tetsuro Sugimoto, IEEE Journal of Solid–State Circuits, A Multibit Delta–Sigma Audio DAC with 120–dB Dynamic Range, vol., 35, No. 8, Aug. 2000, p. 1066–1073.

Daniel Senderowicz, et al., PCM Telephony: Reduced Architecture for a D/A Converter and Filter Combination, 8107 IEEE Journel of Solid–State Circuits 25 (1990) Aug., No. 4, New York, pp. 987–995.

Y.S. Yee, et al., A Two–Stage Weighted Capacitor Network for D/A–A/D Conversion, IEEE Journel of Solid–State Circuits, vol. SC–14, No. 4, Aug. 1979, pp. 778–781.

Joao C. Vital, et al., A Concurrent Two–Step Flash Analogue–to–Digital Converter Architecture, May 1990.

* cited by examiner

C0: C1: C2: C3: C4 = 1:1:2:4:8

$V_M = j/m * V_I + (1-j/m) * V_B$  ($j=0,1,\cdots,m$)

PRIOR ART

DIGITAL TO ANALOG CONVERTER WITH A WEIGHTED CAPACITIVE CIRCUIT

CROSS-REFERENCE TO RELATED APPLICATIONS

This patent application is a continuation-in-part application of copending U.S. patent application Ser. No. 09/982,303, filed on Oct. 17, 2001, now U.S. Pat. No. 6,611,164, the right of priority of which is hereby claimed for this application. This patent application is also related to Japanese Patent Application Serial No. 2000-317998, filed on Oct. 18, 2000 and to Japanese Patent Application Serial No. 2002-107583, filed on Apr. 10, 2002, the rights of priority of which are also hereby claimed for this application.

TECHNICAL FIELD

The present invention relates to a D/A converter that converts digital data into an analog voltage, and in particular, to a D/A converter that uses a weighted capacitive circuit on a CMOS device capable of obtaining high-resolution output with a small area.

BACKGROUND ART

In order to realize a D/A converter on a CMOS device, general use is made of a voltage-scaling type D/A converter in which a plurality of resistors for dividing a voltage are connected in series between two reference voltages, and a divided voltage corresponding to input digital data is selected and output. However, this converter has difficulty in the fact that, in a high bit, variation in the value of resistance deteriorates integral linearity.

In contrast, use is made of a charge-scaling type D/A converter in which a divided voltage between two reference voltages is output by use of a plurality of binary-weighted capacitors whose capacitance values have a ratio of, for example, 1:2:4 making use of the greatness in the ratio precision of capacitance values in a CMOS device. This principle is described, for example, in "Bipolar and MOS Analog Integrated Circuit Design" written by Alan B. Grebene and states that this type has an advantage in a CMOS circuit.

A 4-bit D/A converter embodied on the basis of this principle is shown in FIG. 15, and the operation of the converter will be described with reference to the figure. In FIG. 15, capacitors C1 to C4 are binary-weighted capacitors having the ratio of 1:2:4:8, and a capacitor C0 is a terminating capacitor used to make the sum of capacitance values equal to 16(=2⁴). An end of each of these capacitors is connected to a voltage node N1 in common, and the voltage of this node N1 is connected to an output terminal Vout through a buffer amplifier (AMP). The other ends of the capacitors C0 to C4 are connected to switches SWR0 to SWR4, respectively. Since the switches SWR0 to SWR4 reach a state shown in FIG. 15 in a reset operation, and a switch SWR5 shorts both ends of each capacitor, an electric charge is reset at 0. The electric potential of the node N1 is given by a bias voltage Vb when reset. After the reset operation is performed, the switch SWR5 is turned off, and the switches SWR0 to SWR4 are connected to the side opposite to the state shown in FIG. 15 when an output operation is performed to output a D/A conversion voltage. The independent terminal side of each capacitor is selectively connected to either GND or reference voltage Vref through switches SWD1 to SWD4 controlled by digital data. At this time, only the independent terminal side of the capacitor C0 is fixed to be always connected to GND.

In the thus formed structure and operation, the total electric charges stored in the capacitors in the reset operation and those stored in the output operation are constant according to the law of conservation of charge, and therefore Equation (1) is established wherein Vo is the voltage of the node N1 in the output operation. In Equation (1), V1 to V4 are voltage values at which the independent terminal sides of the capacitors are connected according to digital data, and they are each 0 or Vref.

$$V_o * C0 + (V_o - V1) * C1 + (V_o - V2) * C2 + (V_o - V3) * C3 + (V_o - V4) * C4 = 0 \quad (1)$$

In Equation (1), since Vi (i=1,2,3,4) is controlled by digital data and is either 0 or Vref, Vi can be expressed as Vi=Di*Vref on the supposition that if Di=0, a connection to GND is established (having a value of 0), and, if Di=1, the value becomes equal to Vref wherein Di (i=1,2.3,4) is digital data of each bit. Further, since the capacitor ratio has the relation C0:C1:C2:C3:C4=1:1:2:4:8, voltage Vo is expressed as in Equation (2) by solving Equation (1) under standardization using C0. In Equation (2), D1 to D4 are digital data of each bit, and the values of these are each 1 or 0.

$$V_o = V_{ref} * (D1 + 2*D2 + 4*D3 + 8*D4)/16 \quad (2)$$

According to Equation (2), it is understood that the output of Vout has arbitrary analog voltages from 0 to 15/16Vref in Vref/16 step depending on the method of providing the digital data D1 to D4. If binary-weighted capacitors in which weighting is performed in the ratio of, for example, 1:2:4: . . . :2n−1 are prepared for n bits, and if a capacitor whose ratio is 1 is added as a terminating capacitor, a n-bit D/A converter can be realized as well as the above. At this time, it is understood that 2n unit capacitors are required to realize the n-bit D/A converter under the assumption that the smallest capacitor is a unit capacitor. The voltage applied to the capacitor in the output operation is either GND or Vref in FIG. 15, but, if they are set as two arbitrary reference voltages, output to divide the two reference voltages can be obtained.

Since the capacitor can have higher ratio precision than the resistor on the CMOS device, the charge-scaling type D/A converter shown in FIG. 15 is fundamentally advantageous. However, since the input capacitance of a buffer and the parasitic capacitance Cp by the switch SWR5 exist in the node N1 of FIG. 15 in practice, an electric charge is distributed to this parasitic capacitance, and, as a result, an error occurs. If the voltage of the node N1 is Vb by a bias voltage source in Equation (1) in the reset operation, Equation (1) can be rewritten like Equation (3) in consideration of the electric charge of the parasitic capacitance. Herein, Q is the total electric charge held besides the parasitic capacitance in the output operation in the left term in Equation (1) as shown in Equation (4).

$$Q + V_o * C_p = V_b * C_p \quad (3)$$

$$Q = V_o * C0 + (V_o - X1) * C1 + (V_o - X2) * C2 + (V_o - X3) * C3 + (V_o - X4) * C4 \quad (4)$$

Therefore, as is understood by solving Equation (3) on the assumption that Cp has no voltage dependence, one step of the D/A conversion output decreases to Vref/(16+Cp/C0) because of the influence of the term of the parasitic capacitance Cp shown in Equation (3), and, disadvantageously, an intended output range cannot be obtained. If the parasitic capacitance Cp has voltage dependence, the linearity of the D/A conversion output will also deteriorate. Therefore, the unit capacitor C0 must be enlarged to relatively lessen the influence of the parasitic capacitance. However, this has a problem in that an area occupied by the D/A converter becomes large.

On the other hand, as is understood from Equation (3), the right and left terms of the parasitic capacitance Cp will be canceled, and no error will occur if the voltage Vb of the node N1 in the reset operation is equal to the output voltage Vo. Therefore, Japanese Patent No. 3166603 discloses a method in which, in order to give a voltage nearing the voltage Vo output by the D/A converter as Vb in the reset operation, the output once subjected to the D/A conversion is held by a sample-hold circuit provided behind the buffer of FIG. 15, and its output is given as Vb when second resetting is performed. However, since this method requires a plurality of reset operations to obtain one D/A conversion output, this method is disadvantageous in raising a converting rate. Additionally, the aforementioned conventional methods have a problem in that an offset error caused by the offset voltage of the buffer also occurs in the D/A converter output.

As other background art, "A Multibit Delta Sigma Audio DAC with 120-dB Dynamic Range" (Ichiro Fujimori et. al, IEEE JOURNAL OF SOLID-STATE CIRCUITS VOL.35, NO.8, AUGUST 2000, P.1066) discloses a five-bit SC DAC with hybrid post filter in FIG. 8. However, this Circuit is different type from the above DAC.

SUMMARY OF THE INVENTION

A first object of the present invention is to realize a D/A converter that does not receive influence of an error caused by a parasitic capacitance, which has been a significant problem in a conventional charge-scaling type D/A converter, by using a simple structure and operation, and to provide a D/A converter with a small area but with high precision. A second object of the present invention is to provide a D/A converter having no offset error without receiving influence of the offset voltage of an internal buffer, or the like, that is required to obtain amplified output. A third object of the present invention is to provide a D/A converter with a small circuit scale but with high resolution by overcoming a conventional problem in that a circuit area inevitably becomes extremely large with a rise in resolution because many capacitors are required, such as a case in which a conventional structure requires 256 capacitors in 8 bits and 1024 capacitors in 10 bits. A fourth object, which is a supplementary object, of the present invention is to provide a fully differential D/A converter required for a pipeline type AD converter, or the like, that operates at high speed.

In order to achieve the aforementioned objects, the present invention is structured as follows. That is, the present invention is characterized in that a D/A converter comprises n+1 capacitors in total consisting of one terminating capacitor serving as a unit capacitor and n binary-weighted capacitors that are subjected to binary weighting to the unit capacitor in the ratio of 1:2:4: . . . :2(n−1) and an inverting amplifier for obtaining amplified output, wherein a feedback switching means is provided between the input and output of the inverting amplifier, and first terminal sides of the n+1 capacitors are connected in common to an input terminal of the inverting amplifier, a switching means for terminating operation connecting second terminal side of the terminating capacitor to one of a plurality of reference voltages, and then, connecting the second terminal side of the terminating capacitor to an output of the inverting amplifier; and a plurality of switching means for input operation selectively connecting second terminal sides of the binary weighted capacitors to the plurality of reference voltages, and then, connecting the second terminal sides of the binary weighted capacitors to the output of the inverting amplifier; are provided on the second terminal sides of the capacitors.

The D/A converter is constructed in this way, and the feedback switch of the inverting amplifier is caused to conduct a current and One of reference voltages selected on the basis of digital data is given to each capacitor (to the second terminal of each capacitor) through the switching means for terminating operation and the plurality of switching means for input operation in the reset operation period. And the feedback switching means is turned off and the second terminal sides of all of the capacitors are connected between the input and output of the inverting amplifier by the switching means for terminating operation and the plurality of switching operation for input operation in the output operation period.

By this operation, the output voltage of the inverting amplifier outputs a weighted average value obtained by multiplying a selected reference voltage by a factor weighted by a capacitance value in the output operation. However, the input voltage of the inverting amplifier is always constant because feedback is performed between the input and output thereof in the reset operation period and in the output operation period, and the electric charge of the parasitic capacitance that exists in the input node of the inverting amplifier is also constant. Therefore, an output voltage that does not receive influence of the parasitic capacitance can be obtained. Additionally, the offset voltage of the inverting amplifier is also held in each capacitor in initial resetting, and it functions to correct the offset voltage of the inverting amplifier in the output operation. Therefore, accurate output that does not include the offset voltage of the inverting amplifier is obtained. Accordingly, the first and second objects can be achieved by these means.

In the present invention, the plurality of reference voltages consist of two main reference voltage values that serve as standards and m−1 sub-reference voltage values obtained by dividing a value between the two main reference voltage values into m equal portions. Preferably, either of the two main reference voltage values is selectively given to the second terminal sides of the binary-weighted capacitors by the plurality of switching means for input operation, and any one of the two main reference voltage values and the m−1 sub-reference voltage values is given to the second terminal side of the terminating capacitor by the switching means for terminating operation. Since resolution can be raised by subdividing the sub-reference voltage in this way without increasing the number of binary-weighted capacitors, a high-resolution D/A converter can be realized even if it is small in circuit size. Accordingly, the first, second, and third objects can be achieved.

As a concrete structure for generating the sub-reference voltage, a second D/A converter should be provided, and its output should be connected to the second terminal of the terminating capacitor through the switching means for terminating operation. With this structure, although a conventional 8-bit D/A converter requires 256 unit capacitors, the structure of the present invention can be completed by two 4-bit D/A converters. Therefore, it is understood that an 8-bit D/A converter can be structured by 16*2, i.e., 32 unit capacitors, and a high-resolution D/A converter can be realized even if it is small in circuit size. It can be said that this is very effective for a D/A converter that requires precision and that is great in the number of bits because a greater difference in circuit size is generated proportionately with a rise in resolution.

As another concrete means for generating the sub-reference voltage value, a sample-hold circuit may be provided for output of the inverting amplifier that constitutes the D/A converter, and the output of the sample-hold circuit may be connected to the second terminal of the terminating capacitor. Accordingly, since the sample-hold circuit can be generally formed with a smaller area than the D/A converter, a high-resolution D/A converter can be structured with an even smaller circuit size than a case in which two D/A converters are used.

One means of the sample-hold circuit can be realized by using the terminating capacitor itself as a sample-hold circuit such that a next reset operation of the D/A converter is performed while holding only the signal electric charge held in the terminating capacitor among signal output charges temporarily stored in the terminating capacitor and in the binary-weighted capacitors as D/A converter outputs. Thereby, a high-resolution D/A converter with an even smaller circuit size can be realized.

Another means for realizing a high-resolution D/A converter with a small circuit size can be formed in the present invention as follows. A D/A converter comprises n+1 capacitors in total consisting of one terminating capacitor serving as a unit capacitor and n binary-weighted capacitors that are subjected to binary weighting to the unit capacitor in the ratio of 1:2:4: . . . :2(n−1) and an inverting amplifier for obtaining amplified output, wherein a feedback switching means is provided between the input and output of the inverting amplifier, and first terminal sides of the n+1 capacitors are connected in common to an input terminal of the inverting amplifier, a switching means for terminating operation connecting second terminal side of the terminating capacitor to one of the reference voltages, and then, connecting the second terminal side of the terminating capacitor to an output of the inverting amplifier, a plurality of switching means for input operation selectively connecting second terminal sides of the binary weighted capacitors to a plurality of reference voltages and then connecting the second terminal sides of the binary weighted capacitors to an output of the inverting amplifier;

are provided on the second terminal sides of the capacitors. Two sets of D/A converters each of which is the D/A converter constructed as above are provided in parallel, and two voltages mutually different in main reference voltage are given to the terminating capacitors of the two sets of D/A converters, and the outputs of the two sets of D/A converters are given to two reference voltage input signal lines through the sample-hold circuit. Accordingly, likewise, a high-resolution D/A converter with a small circuit size can be realized by this structure.

Preferably, in the present invention, the inverting amplifier is a fully differential 2-input/2-output operational amplifier, and the n+1 capacitors, the switching means for terminating operation, the plurality of switching means for input operation, and the feedback switching means are provided to each input and output in two sets. Concerning the reference voltages given by the switching means for terminating capacitor and the plurality of switching means for input operation, one of the two main reference voltages different is given in each corresponding capacitor in the system of two sets. Accordingly, a fully differential D/A converter required for a pipeline type AD converter, or the like, that operates at high speed can be realized, and the first to fourth objects can be achieved.

EMBODIMENTS OF THE INVENTION

First Embodiment

Figure 1:
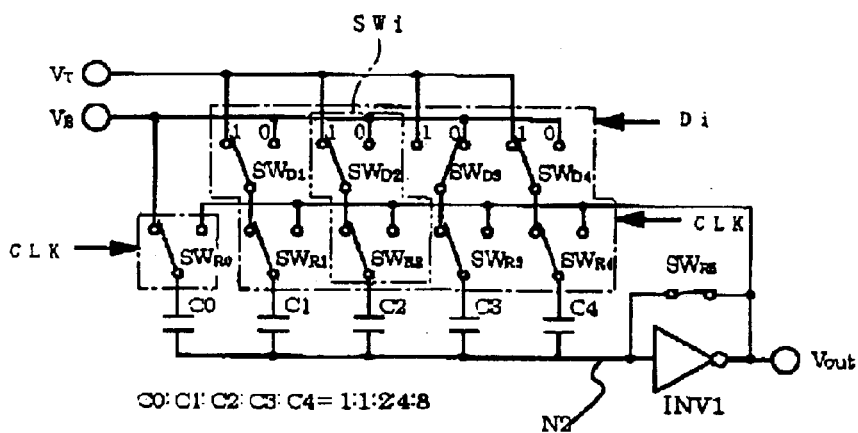
FIG. 1 is a circuit diagram showing a 4-bit D/A converter of a first embodiment for explaining the basic operation of the present invention.

FIG. 1 is a 4-bit D/A converter shown as a first embodiment to explain the basic operation of the present invention. In FIG. 1, capacitors C1 to C4 are binary-weighted capacitors the capacitance-value ratio of which is 1:2:4:8, and capacitor C0 is a terminating capacitor the capacitance-value ratio of which is 1. One end of each of these capacitors C0 to C4 is connected in common to an input node N1 of an inverting amplifier (INV1). The other end of each of the capacitors C1 to C4 is independently connected to either of a bottom reference voltage VB and a top reference voltage VT that serves as two main reference voltages in the reset operation, and is connected to switches SWR0 to SWR4 that are connected in common to an output of the inverting amplifier INV1 in the output operation. In the binary-weighted capacitors C1 to C4, the main reference voltage connected to each capacitor is selectively given by the switches SWD1 to SWD4 controlled on the basis of digital data, and, in the terminating capacitor C0, the bottom reference voltage VB is given fixedly in the reset operation. A feedback switch SWR5, which reaches an ON (short) state in the reset operation and reaches an OFF (open) state in the output operation, is provided between the input and output of the inverting amplifier INV1.

In the thus formed structure, the switch SWR5 between the input and output of the inverting amplifier INV1 is turned on so as to create a short circuit in the reset operation, and the voltage of an input terminal node N2 of the inverting amplifier INV1 becomes equal to a threshold voltage Vth of the inverting amplifier INV1. The total electric charge Q stored in the capacitors C0 to C4 is expressed as Equation (5) wherein V1 to V4 are voltages given to the independent terminal side of each capacitor. Herein, V1 to V4 take either of the voltage values VB and VT.

$$Q=(Vth-VB)*C0+(Vth-V1)*C1+(Vth-V2)*C2+(Vth-V3)*C3+(Vth-V4)*C4 \qquad (5)$$

Thereafter, the SWR5 is turned off in the output operation, and the second terminal side of each capacitor, which are in the side of SWR0 to SWR4, is connected in common to the output of the inverting amplifier INV1. If the open loop gain of the inverting amplifier INV1 is sufficiently high at this time, the input node N2 of the inverting amplifier INV1 is held at Vth as in the reset operation, and therefore the total electric charge Q' of the capacitors stored therein is expressed as Equation (6) wherein Vo is the output voltage of the inverting amplifier INV1.

$$Q'=(C0+C1+C2+C3+C4)*(Vth-Vo) \qquad (6)$$

Since Vi (i=1,2,3,4) is controlled by digital data and is either VB or VT in Equations (5) and (6), Vi can be expressed as Vi=Di*$\Delta$V+VB($\Delta$V=VT-VB) wherein Di (i=1,2,3,4) is digital data of each bit, and a connection to VB is established when Di=0, and a connection to VT is established when Di=1. Additionally, output voltage Vo can be obtained according to Equation (7), using the fact that the relation Q=Q' exists between Q and Q' by the law of conservation of charge, and fact that the capacitor ratio is C0:C1:C2:C3:C4=1:1:2:4:8.

$$Vo=\Delta V*(D1+2*D2+4*D3+8*D4)/16+VB \qquad (7)$$

According to Equation (7), it is understood that, concerning the output Vo of the D/A converter, an arbitrary analog voltage from VB to (15/16)$\Delta$V+VB can be obtained in $\Delta$V/16 step depending on the method of providing digital data D1 to D4, and a 4-bit D/A converter is realized. Likewise, an n-bit D/A converter can be realized by providing binary-weighted capacitors subjected to weighting in the ratio of 1:2:4: . . . :2n-1 for n bits and providing another capacitor as a terminating capacitor whose ratio is 1. If this structure is used, no influence will be received from a parasitic capacitance, because the electric potential of the node becomes equal to the threshold voltage value Vth of the inverting amplifier both in the output operation and in the reset operation, and is constant even if a parasitic capacitance exists in the node N2. Although Equations (5) and (6) have the threshold voltage value Vth of the inverting amplifier, its influence is not included in the output voltage Vo, as can be understood from Equation (7). The reason is that the threshold voltage is held beforehand in each capacitor in the reset operation, and an action to offset the threshold voltage is performed in the output operation.

In this embodiment, SWR0 is corresponding to the switching means for terminating operation, SWi (=SWDi+SWRi) (i=1-4) are corresponding to the switching means for input operation as illustrated in FIG. 1. This embodiment includes 4 switching means for input operation.

Figure 2:
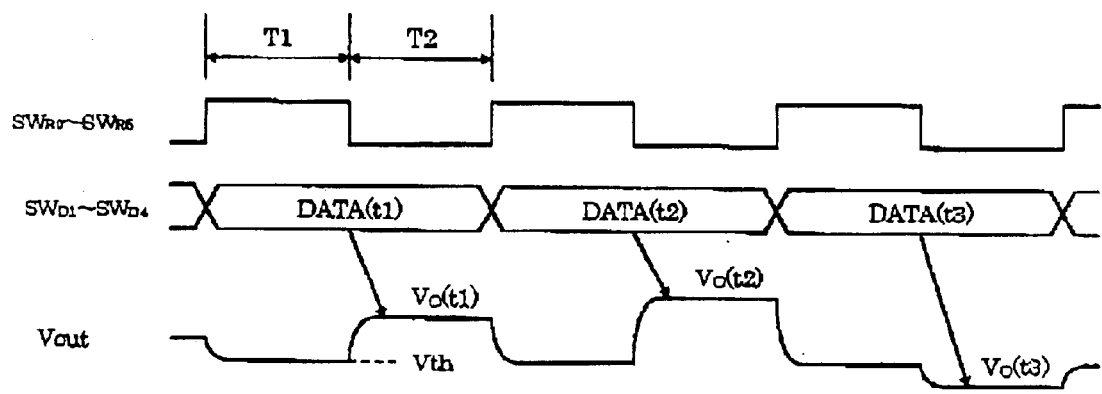
FIG. 2 is a timing diagram for explaining the operation of FIG. 1.

As shown in FIG. 2, the operation described above is shown in the form of a timing chart. In FIG. 2, period T1 is a reset operation period, and the state of SWR0 to SWR5= "H" is shown in FIG. 1. SWD1 to SWD4 are controlled by the digital data of DATA(t) during this period, and either of the reference voltages is given to the independent (second) terminal side of the capacitors C0 to C4. Since SWR5 is also in an on state at this time, the output voltage Vout becomes equal to the threshold voltage value Vth of the inverting amplifier. Period T2 is an output operation period. SWR0 to SWR5 take a state reversed from the state taken in the reset operation, and SWR5 is turned off. The capacitors C0 to C4 are connected between the input and output of the inverting amplifier, and analog output with respect to the given digital data is output from Vout=Vo(t1). Accordingly, the D/A converter of the present invention can be realized by two operations, i.e., by the reset operation and the output operation, and, unlike Japanese Patent No. 3166603 of FIG. 15 made by improving the conventional device, a D/A converter of high precision can be realized without performing a plurality of reset operations.

Figure 15:
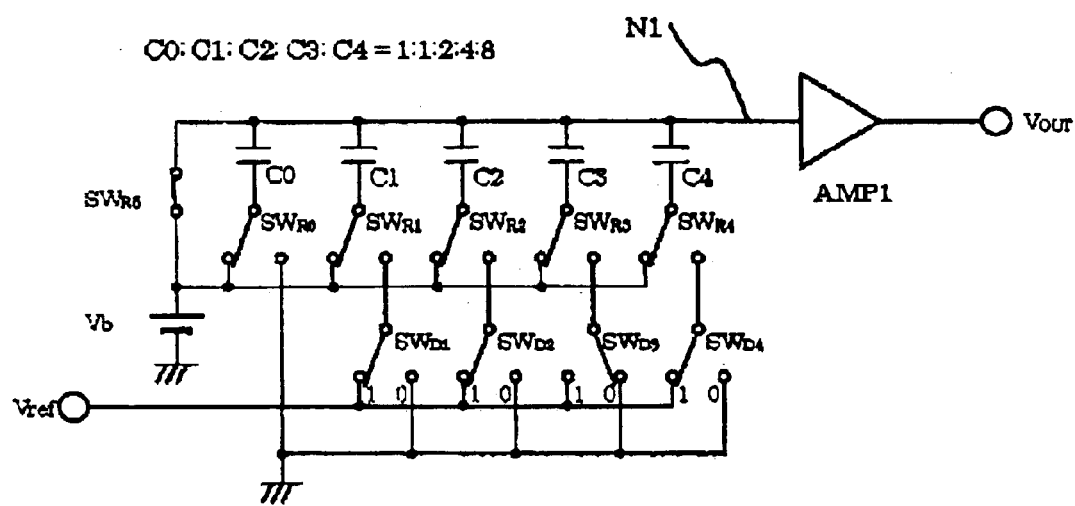
FIG. 15 is a circuit diagram showing a conventional D/A converter.

As shown above, the D/A converter of FIG. 1 according to the present invention can obtain D/A conversion output having no influence from the parasitic capacitance according to an easy operating method and without increasing the circuit size, in comparison with the prior art device of FIG. 15. Therefore, a D/A converter of excellent precision can be made even if it is small in unit capacitor size, and a D/A converter of high precision with a small area can be realized. Additionally, in the present invention, amplified output can be obtained without receiving the influence of an offset voltage caused by a variation in the threshold voltage of the inverting amplifier. Therefore, a D/A converter having no offset error can be realized. Thus, according to the first embodiment shown above, it is understood that the first object of the present invention, i.e., the object of realizing a D/A converter receiving no influence of an error caused by the parasitic capacitance by a simple structure and by a simple operation that is achieved, and the second object of the present invention, i.e., the object of realizing a D/A converter without an offset error that is realized can be achieved.

The foregoing description has been made on the assumption that the open loop gain of the inverting amplifier is extremely great, and the electric potential of the node N2 of the inverting amplifier INV1 is constant at Vth. In connection with this, a brief description will be given of the influence of this open loop gain. In FIG. 1, if the open loop gain of the inverting amplifier INV1 is represented as Av, and if the output of the inverting amplifier INV1 changes from VB to VT, the electric potential of the node N2 changes by (VT-VB)/Av. Therefore, if the parasitic capacitance of the node N2 is represented as Cp, an influence received from the parasitic capacitance is Cp/Av in actuality, and, strictly speaking, an error is caused by this. However, since the influence of the parasitic capacitance is reduced to 1/Av in comparison with the conventional D/A converter, a D/A converter having no problem from the viewpoint of practical use can be constructed without increasing the unit capacitor very greatly if the gain of the inverting amplifier INV1 is enlarged to some degree.

Figure 3:
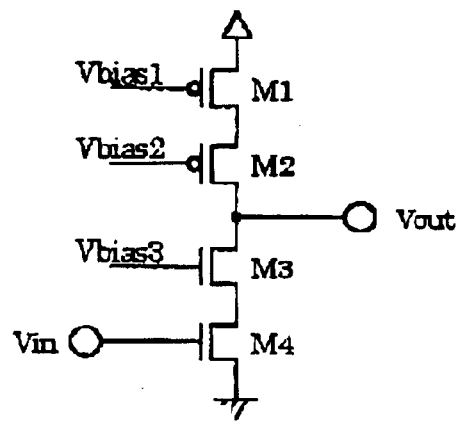
FIG. 3 is an example of the structure of an inverting amplifier of FIG. 1.

FIG. 3 shows one example of the concrete structure of the inverting amplifier of FIG. 1. In FIG. 3, the inverting amplifier is made up of PMOS (p-type metal oxide semiconductor) transistors M1 and M2 and NMOS (n-type metal oxide semiconductor) transistors M3 and M4 stacked upright, and a CMOS inverting amplifier is made up of the NMOS transistor M4 whose gate serves as the input Vin of the inverting amplifier and which operates as a common-source amplification transistor and the PMOS transistor M1 serving as a constant-current source type load in which a bias voltage Vbias1 is connected to the gate, and the source is connected to a power source. In this amplifier, in order to enlarge the open loop gain, the NMOS transistor M3 whose gate is connected to the bias voltage Vbias3 is connected to the drain of the NMOS transistor M4, and the PMOS transistor M2 whose gate is connected to the bias voltage Vbias2 is connected to the drain of the PMOS transistor M1, each in the form of a cascode connection. Since a high open loop gain can be obtained by the cascode connection even in the inverting amplifier formed by this simple structure, a D/A converter of high precision without an offset voltage can be realized in the D/A converter having the structure of FIG. 1.

Second Embodiment

Next, referring to FIG. 4, a description will be given of a method of realizing a D/A converter with a small circuit size even when the resolution is increased in the present invention. Normally, when the intention is accomplished to obtain n-bit resolution by using the conventional structure of FIG. 15 or the structure of the present invention of FIG. 1, the full capacitor size with respect to the unit capacitor is 2n because the ratio of required binary-weighted capacitors is 1:2:4:. . . :2(n−1). This is, for example, 256 in 8 bits and is 1024 in 10 bits which become exponentially great, and an extremely large circuit area is required for a high-resolution D/A converter. A method for solving this problem is shown in FIG. 4.

Figure 4:
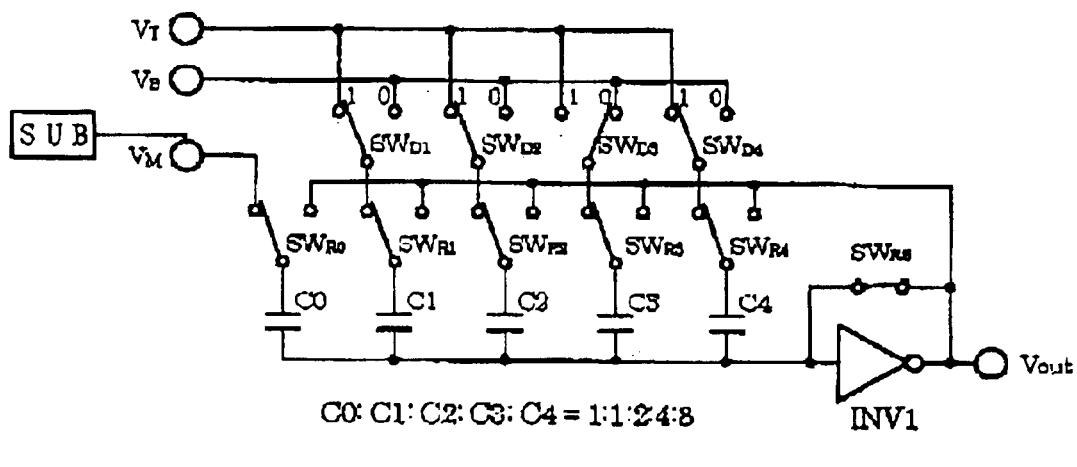
FIG. 4 is a circuit diagram showing a D/A converter of a second embodiment that uses the present invention.

The structure of FIG. 4 is exactly identical to that of FIG. 1 except for the voltage given to the terminating capacitor C0, and is made up of an inverting amplifier (INV1), a feedback switch SWR5 provided between the input and output of the inverting amplifier INV1, binary-weighted capacitors C1 to C4 an end each of which is connected in common to the input of the inverting amplifier INV1, a terminating capacitor C0, and switches SWR0 to SWR4 that are independently provided at the other end of each of the capacitors, that are selectively connected to reference voltages VT, VB, or VM in the reset operation, and that are connected to the output terminal Vout of the inverting amplifier in the output operation. Like FIG. 1, the reference voltage is drawn to be given through the switches SWD1 to SWD4 controlled by digital data in this figure for a better understanding. The voltage given to C0 during the reset operation is fixed at VB in FIG. 1, whereas an intermediate potential VM, which takes any one of j=0, 1, . . . , m−1 (m is a natural number of 2 or greater) among the electric potentials VM=j/m*VT+(1−j/m) * VB obtained by dividing the region from the bottom reference voltage value VB to the greatest voltage value VT into m equal portions, is given to C0 in FIG. 4.

In this structure, when the D/A conversion output Vo is calculated using the law of conservation of charge in the same way by which the output voltage is calculated in FIG. 1, the D/A conversion output Vo can be obtained from Equation (8). In Equation (8), k is expressed as k=D1+2*D2+4*D3+8*D4 from the values of digital data D1 to D4 by which SWD1 to SWD4 are controlled and falls within the range k=0–15, and j is a value obtained when the electric potential given to the terminating capacitor C0 is expressed as VM=j/m*VT+(1−j/m) * VB and falls within the range j=0 to m−1.

$$Vo=\Delta V*(k/16+j/(16*m))+VB \quad (8)$$

In Equation (8), let m be 16 as one example. Since j takes any one of j=0 to 15, and, likewise, k takes any one of k=0 to 15, it is understood that (k/16+j/(16*m)) is arbitrarily given in the range of 0 to 255/256 as a number of 1/256 step. This means that Vo takes any one of 256 equal portions resulting from the division between the reference voltages VB and VT. In other words, this shows that 8-bit D/A converter output is realized. Therefore, it is understood that a high-resolution D/A converter can be realized by making the voltage given to the terminating capacitor variable in a small step as shown in FIG. 4 even if a 4-bit D/A converter having the same structure as that of FIG. 1 is used.

As one method, a sub reference voltage of this small step can be generated from the two reference voltages by a sub reference generated circuit SUB, for example, a string of 16 resistors in series between the reference voltages VB and VT. Accordingly, an 8-bit D/A converter can be realized by selectively giving either of the voltages at the connection point to the terminating capacitor through the switch. Thus, either of the sub-reference voltages generated by the division between the two main reference voltages is given to the terminating capacitor as VM, and, as a result, resolution can be increased by adding a relatively small circuit size. Therefore, a high-resolution D/A converter can be realized not by simply increasing the capacitor and raising the number of bits, but by using a smaller circuit size. According to the second embodiment shown in FIG. 4, it is understood that not only the first and second objects of the present invention but also the third object of realizing a high-resolution D/A converter with a small circuit size can be achieved.

Third Embodiment

Figure 5:
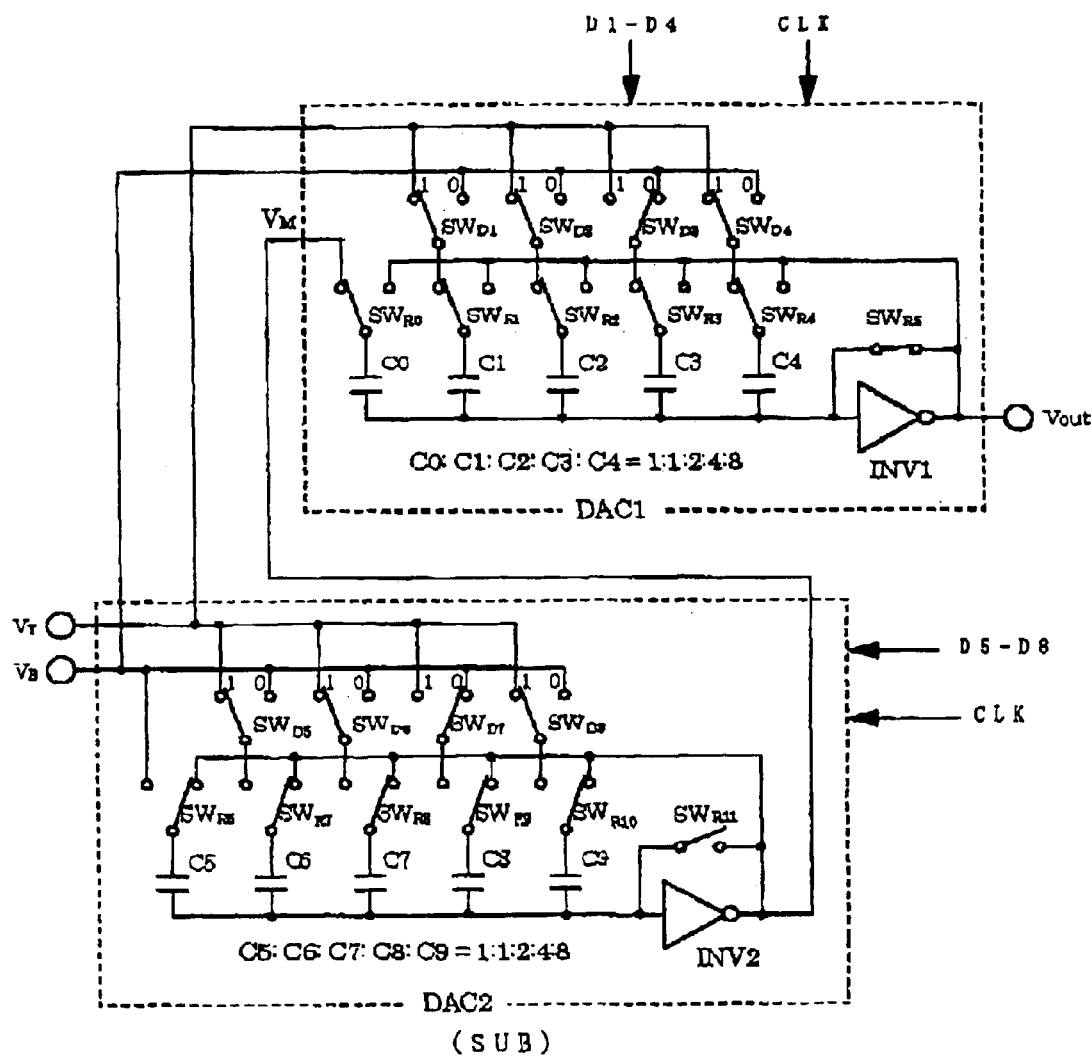
FIG. 5 is a circuit diagram showing an 8-bit D/A converter of a third embodiment of the present invention.

Next, referring to FIG. 5, a description will be given of a third embodiment formed as a more concrete structure based on the second embodiment shown in FIG. 4. In the foregoing description, it has been mentioned that the sub-reference voltage can be generated by a string of a plurality of resistors in series. However, the capacitor can obtain higher precision than the resistor in a CMOS process. FIG. 5 shows an 8-bit D/A converter realized by adding a D/A converter having the same structure as that of FIG. 1 as a sub reference voltage generating circuit SUB and by combining two 4-bit D/A converters together so that the precision of the sub-reference voltage can be determined by a capacitance-value ratio without using the resistor string.

In FIG. 5, DAC2 is a 4-bit D/A converter having the same structure as that of FIG. 1, and is made up of an inverting amplifier INV2, a feedback switch SWR11 provided between the input and output of the inverting amplifier INV2, binary-weighted capacitors C6 to C9 an end each of which is connected in common to the input of the inverting amplifier INV2, a terminating capacitor C5, and switches SWR6 to SWR10 and SWD5 to SWD8 that are independently provided at the other end of each of the capacitors, that are selectively connected to reference voltages VT and VB in the reset operation, and that are connected to the output terminal of the inverting amplifier INV2 in the output operation. Likewise, another D/A converter DAC1 is made up of an inverting amplifier INV1, a feedback switch SWR5, binary-weighted capacitors C1 to C4, a terminating capacitor C0, switches SWR0 to SWR4, and switches SWD1 to SWD4 . The output of DAC2 is given to the terminating capacitor C0 of DAC1 through the switch SWR0. Since DAC2 functions as a lower-bit D/A converter to give the sub-reference voltage VM to the terminating capacitor C0 of DAC1 in this structure, the D/A conversion output of 8-bit precision is obtained from the output of DAC1 by inputting the lower 4-bit data to the switches SWD5 to SWD8 and by inputting the upper 4-bit data to the switches SWD1 to SWD4 of DAC1.

Referring to the timing chart of FIG. 6, a description will be given of a D/A conversion operation in the structure of FIG. 5. Let it be supposed that the switches SWR0 to SWR11 are each in the state of FIG. 5 at "H", whereas they are in the inverse of the state of FIG. 5 at "L" in this timing chart. Further, let it be supposed that states specified by digital data D1 to D8 are given to the switches SWD1 to SWD8, respectively.

Figure 6:
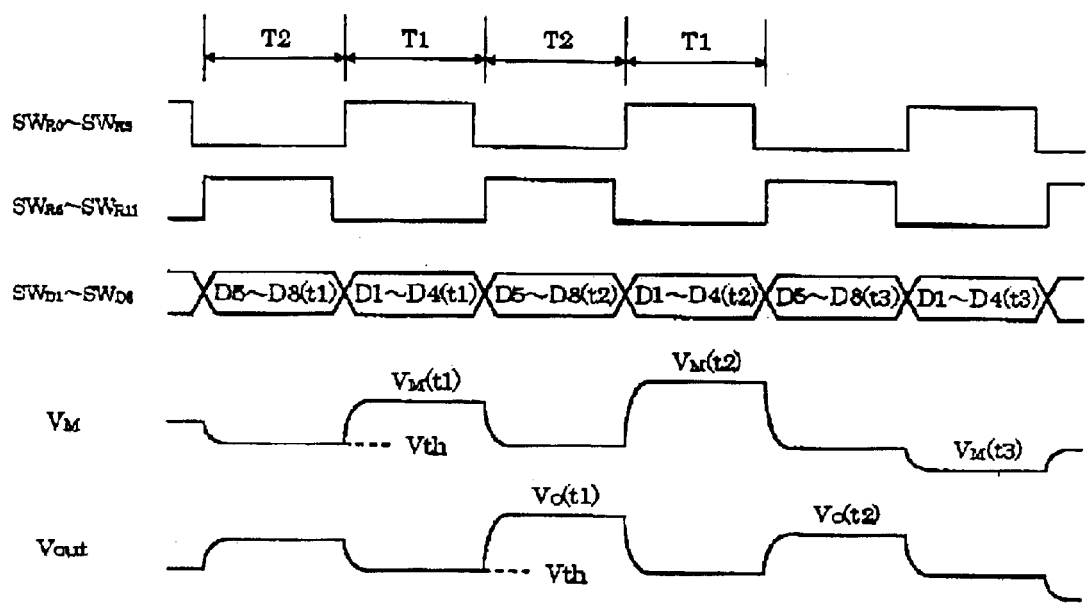
FIG. 6 is a timing diagram for explaining the operation of FIG. 5.

In FIG. 6, the operation is roughly divided into two periods, i.e., period T1 and period T2. The two periods are clearly divided into the reset operation period and the output operation period in FIG. 2, but, in FIG. 6, T1 is a output operation period of DAC2 for lower bits, and, at the same time, is an reset operation period of DAC1 for upper bits, and T2 is a reset period of DAC2 for lower bits and an output period of DAC1 for upper bits, so that a D/A converter for lower and upper bits operates while alternately repeating the resetting and the outputting. A detailed description thereof is as follows. First, during (output operation) period T2, lower-bit data based on data D5 to D8 are given to lower-bit DAC2, and resetting is performed. At this time, DAC1 outputs the D/A conversion output that has received data input before then. Thereafter, during (reset operation) period T1, DAC2 for lower bits operates an output operation, and the output of DAC2 is given to the terminating capacitor C0 for upper bits, and, at the same time, the reset operation of DAC1 is performed while giving a reference voltage, which depends on upper-bit data D1 to D4, to the binary-weighted capacitors C1 to C4. Thereafter, during the output operation period (the reset period of lower-bit DAC2) T2 in which lower-bit data is given to the lower-bit DAC2, the analog output based on the digital data previously given by T1 and T2 is output from Vout that is the output of DAC1 again.

In these operations, the output of DAC2 in FIG. 5 is the output of divided voltages obtained by dividing the region between two reference voltages VB and VT into 16 equal portions (aliquots) like VM shown in FIG. 4. Therefore, it is understood that the output of 8-bit precision is obtained like the example given by the description of FIG. 4. Normally, 256 unit capacitors are required if the structure of FIG. 1 is simply extended and applied to 8 bits. However, in the structure of FIG. 5, the unit capacitor corresponds to two 4-bit D/A converters, and, from the equation 16*2=32, the structure can be formed by 32 unit capacitors in total. Therefore, a high-resolution D/A converter can be realized with a small circuit area, and this effect can exert a large influence proportionately with a rise in resolution. As shown in the timing chart, digital data D1 to D8 should each give 4 bits while alternating upper bits and lower bits. Therefore, since a data-holding circuit for 8 bits that are normally required for an 8-bit D/A converter is satisfied by 4 bits, there is an effect by which the circuit size in this part can be reduced. As described above, in the embodiment of FIG. 5, it can be said that the first to third objects of the present invention can be achieved like the embodiment of FIG. 4, and a larger effect is brought about in the CMOS device especially because resistors are not used.

Fourth Embodiment

As described above, in the embodiment of FIG. 5, two D/A converters are used, and one of them is used as a sub-reference voltage generating converter. In a fourth embodiment, a smaller circuit size can be realized performing a similar operation by the output of a single D/A converter. This embodiment is shown in FIG. 7.

Figure 7:
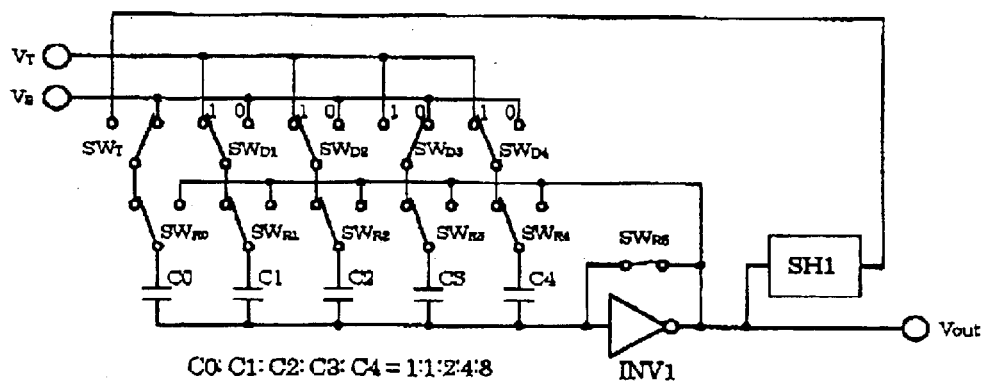
FIG. 7 is a circuit diagram showing a D/A converter of a fourth embodiment of the present invention.

The structure shown in FIG. 7 is made up of an inverting amplifier INV1, a feedback switch SWR5, binary-weighted capacitors C1 to C4, a terminating capacitor C0, switches SWR0 to SWR5, and switches SWD1 to SWD4 for data input. This structure is exactly identical to that of FIG. 1 and that of FIG. 4, and this part is the structure of a 4-bit D/A converter without a change in form. The structure of FIG. 7 is characterized in that a sample-hold circuit SH1 is provided at the output of the inverting amplifier INV1 in the 4-bit D/A converter, the output of the D/A converter that has been once output is held in the sample-hold circuit SH1 by connecting the output of the sample-hold circuit SH1 to one terminal of the selector switch SWT, and thereafter its voltage is given to the terminating capacitor C0 through the switches SWT and SWR0.

Figure 8:
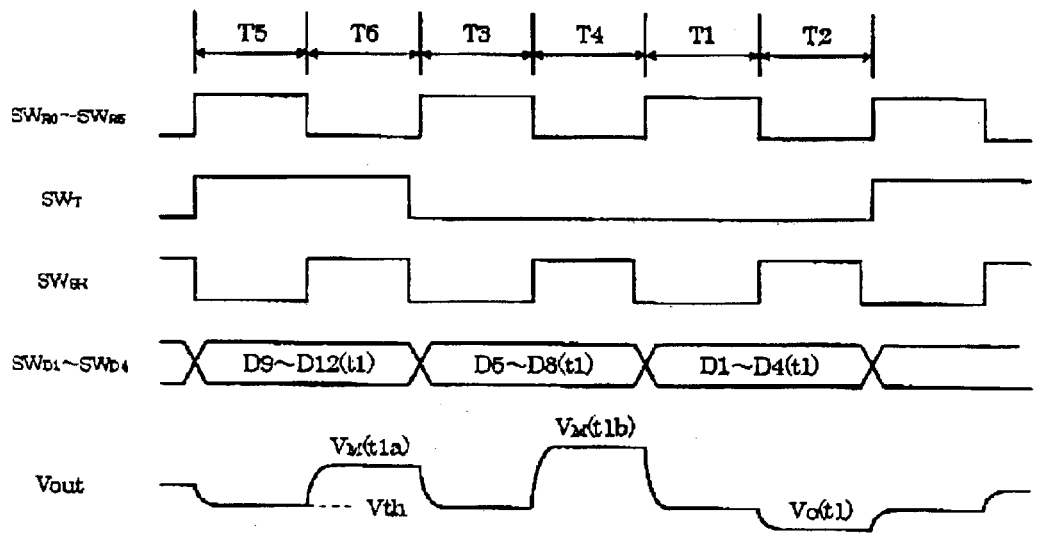
FIG. 8 is a timing diagram to realize the resolution of 12-bit precision by the D/A converter of FIG. 7.

A timing chart to obtain the output of 12-bit precision is shown in FIG. 8 as an example for explaining a method of obtaining high-resolution D/A conversion output by use of the structure of FIG. 7. In this timing chart, let it be supposed that "H" of the switches SWR0 to SWR5 and the switch SWT is a state shown in FIG. 7, and "L" is a state inverting the state of FIG. 7. Let it be further supposed that the states of the switches SWD1 to SWD4 are fixed by digital data that have been input every 4 bits, and the sample-hold circuit SH1 samples the D/A conversion output when a circuit control switch SWSH (not shown) is "H", and is held when the switch is "L".

As shown in FIG. 8, the output of 12-bit precision is obtained by three D/A conversion operations of periods T1 to T6. Period T5 has a first reset operation. During this period, lower 4-bit data D9 to D12 of 12-bit digital data are given to the switches SWD1 to SWD4, and the switch SWT is reset in the state of selecting the side of the bottom reference voltage value VB. Thereafter, during period T6, the output voltage value VM(t1a) of 4-bit precision corresponding to the state of the reset operation in period T5 is output from the output Vout of the D/A converter, and its voltage value is sampled by the sample-hold circuit SH1. Period T3 has a second reset operation, and intermediate 4-bit data D5 to D8 among the 12-bit digital data are given to the switches SWD1 to SWD4. At this time, the switch SWT reaches the state of selecting the output side of the sample-hold circuit SH1, and a sub-reference voltage of 4-bit precision is given to the terminating capacitor C0. Therefore, in the output operation of the next period T4, the output VM(t1b) of 8-bit precision is output from Vout in the same way as is obtained by the output of DAC1 of FIG. 5, and is again sampled by the sample-hold circuit SH1. In the third reset operation of period T1, the upper-bit data of the data D1 to D4 are given to the switches SWD1 to SWD4 like the second reset operation, and the sub-reference voltage of 8-bit precision obtained in period T4 is given to the terminating capacitor because the switch SWT has selected the output side of the sample-hold circuit SH1. Thereby, the output Vo(t1) of 12-bit precision is obtained in period T2.

Resolution can be fundamentally increased without the upper bound by repeating the D/A conversion operation a plurality of times using the structure of FIG. 7 in this way. From a comparison between the structure of FIG. 7 and that of FIG. 5, it is understood that, in FIG. 7, the D/A converter DAC2 of FIG. 5 has been replaced with the sample-hold circuit SH1. Generally, a circuit can be realized with a smaller area in the sample-hold circuit than in the D/A converter. Therefore, the method shown in the fourth embodiment can be expected to have an equivalent effect with a smaller area than in the third embodiment, and the first, second, and third objects of the present invention, which are achieved in the third embodiment, can be achieved, of course.

Fifth Embodiment

In FIG. 7, a method has been shown for increasing resolution by using the sample-hold circuit while holding the sub-reference voltage of a small step. However, as a result of sufficient consideration to the output operation of the D/A converter in the present invention, it is understood that the capacitors C0 to C4 are connected in parallel between the input and output of the inverting amplifier in the output operation, and an electric charge to the output voltage is held in each capacitor at this time. Therefore, an effect similar to that of the fourth embodiment can be obtained by using this electric charge without newly adding another sample-hold circuit. A method of increasing resolution without newly adding a D/A converter or a sample-hold circuit is shown as a fifth embodiment in FIG. 9.

Figure 9:
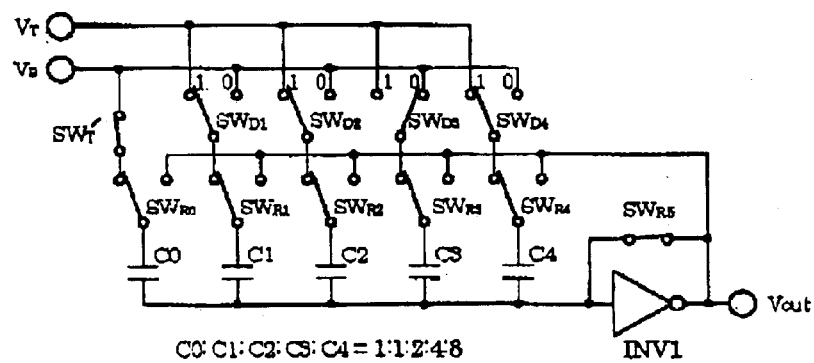
FIG. 9 is a circuit diagram showing a D/A converter of a fifth embodiment of the present invention.

As can be understood from a comparison between FIG. 9 and FIG. 7, the structure of FIG. 9 is identical to that of FIG. 7 except that the sample-hold circuit SH1 of FIG. 7 is removed and that the switch SWT' connected to the terminating capacitor C0 has been changed from the selector type switch to the ON/OFF type switch. All that is understood from a comparison with the circuit of FIG. 1 is that the switch SWT' has been added to the terminating capacitor.

Figure 10:
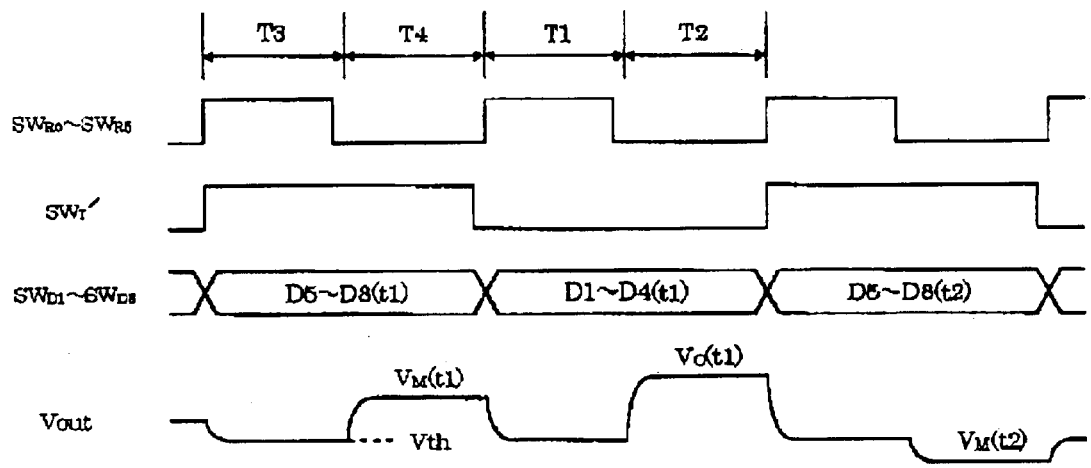
FIG. 10 is a timing diagram for explaining the operation of FIG. 9.

Next, a description will be given of the operation of FIG. 9 with reference to the timing chart for the operation as an 8-bit D/A converter shown in FIG. 10. As shown by periods T1 to T4 of FIG. 10, basically, 8-bit precision can be obtained by repeating the reset operation and the output operation twice. Like the aforementioned embodiments, let it be supposed that, in this timing chart, "H" of the switches SWR0 to SWR5 and the switch SWT' is a state shown in FIG. 9, and "L" is a state inverting the state of FIG. 9, and the states of the switches SWD1 to SWD4 are fixed by digital data that have been input every 4 bits.

In (the first reset operation) period T3, the bottom reference voltage VB is given to the terminating capacitor C0 when SWT'="H", and either the bottom reference voltage VB or the top reference voltage VT is given to the binary-weighted capacitors C1 to C4 by lower bits of digital data D5 to D8 (t1) given to the switches SWD1 to SWD4 in period T3. The analog output VM(t1) of 4-bit precision to these data is generated at the terminal Vout by connecting the switches SWR0 to SWR4 to the reversing output side in the next period T4. Since C0 to C4 are connected between the input and output of the inverting amplifier INV1 at this time, the electric charge to the output voltage is held. Thereafter, the switch SWT' reaches an OFF state, and the electric charge of C0 is held in the second reset operation of period T1, but the binary-weighted capacitors C1 to C4 are rewritten into the voltage value of VB or VT with respect to the upper bits of digital data D1 to D4 (t1). An electric charge to the output voltage VM(t1) of 4-bit precision of period T4 is held in the terminating capacitor C0 when the switch SWT' reaches an OFF state in this way, and this is exactly equivalent to giving the sub-reference voltage of 16 step. Therefore, as in the embodiments described referring to FIGS. 4, 5, and 7, the analog output Vo(t1) of 8-bit precision to the digital data D1 to D8 (t1) is obtained from the terminal Vout in period T2.

Accordingly, an effect similar to that of the structure including the sample-hold circuit as in FIG. 7 can be obtained by controlling the switch connected to the terminating capacitor, and resolution can be increased by adding one switch in comparison with the 4-bit D/A converter of FIG. 1. Although 8-bit signal precision has been obtained by repeating the reset operation and the output operation twice in the timing chart of FIG. 10, 12-bit signal precision can be obtained by repeating the operations three times, and 16-bit signal precision can be obtained by repeating the operations four times. Therefore, fundamentally, resolution can be increased without the upper limit. As described above, in the fifth embodiment of the present invention shown in FIG. 9, the first, second, and third objects of the present invention can be achieved as in the foregoing embodiments, and this embodiment is superior especially in that high resolution can be obtained with the smallest area among the areas of the foregoing embodiments.

Sixth Embodiment

In the aforementioned embodiments, resolution has been increased by changing the step of the sub-reference voltage given to the terminating capacitor into small step portions in the basic structure of the D/A converter of the present invention shown in FIG. 1. However, high resolution can be obtained by combining low-resolution D/A converters together as in the aforementioned embodiments by performing the feedback of a small sub-reference voltage obtained by a D/A conversion as a main reference voltage given to the D/A converter. Therefore, as a sixth embodiment, FIG. 11 shows a method of increasing resolution by performing the feedback of D/A conversion output to a reference voltage.

Figure 11:
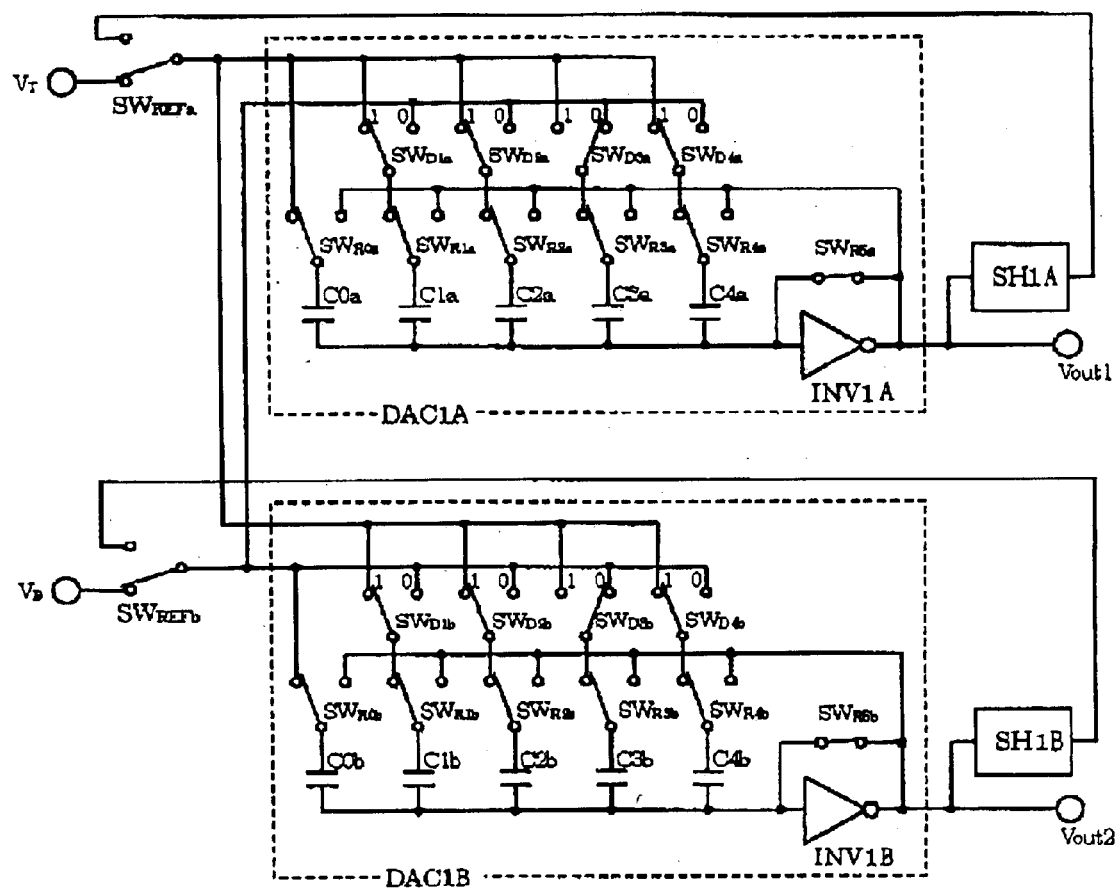
FIG. 11 is a circuit diagram showing a D/A converter of a sixth embodiment of the present invention.

As shown in FIG. 11, this circuit is made up of two 4-bit D/A converters shown as DAC1A and DAC1B that are each enclosed by the broken line, sample-hold circuits SH1A and SH1B that are provided at the respective outputs, and switches SWREFa and SWREFb used to select reference voltages given to the two D/A converters. Concerning the basic structure of each of the two D/A converters among them, DAC1B is the same as the 4-bit D/A converter of FIG. 1, and an end of the switch SWR0$b$ connected to the terminating capacitor of DAC1B is connected to the input of a reference voltage having a low (bottom) voltage value VB, whereas an end of the switch SWR0$a$ of DAC1A is connected to the input of a reference voltage having a high (top) voltage value VT. Because of this connection difference, DAC1A generates the output of a voltage that is higher by 1 LSB (Least Significant bit) than DAC1B when the same digital data is given to the switches SWD1$a$ to SWD4$a$ and SWD1$b$ to SWD4$b$ of DAC1A and DAC1B. The switch SWREFa is a selector switch for high (top) reference voltage input, and the switch SWREFb is a selector switch for low (bottom) reference voltage input. These switches are designed to select one of two voltages which are the reference voltage value VT as a base value and the output of the sample-hold circuit SH1A, or, the reference voltage value VB as a base value and the output of the sample-hold circuit SH1B.

Figure 12:
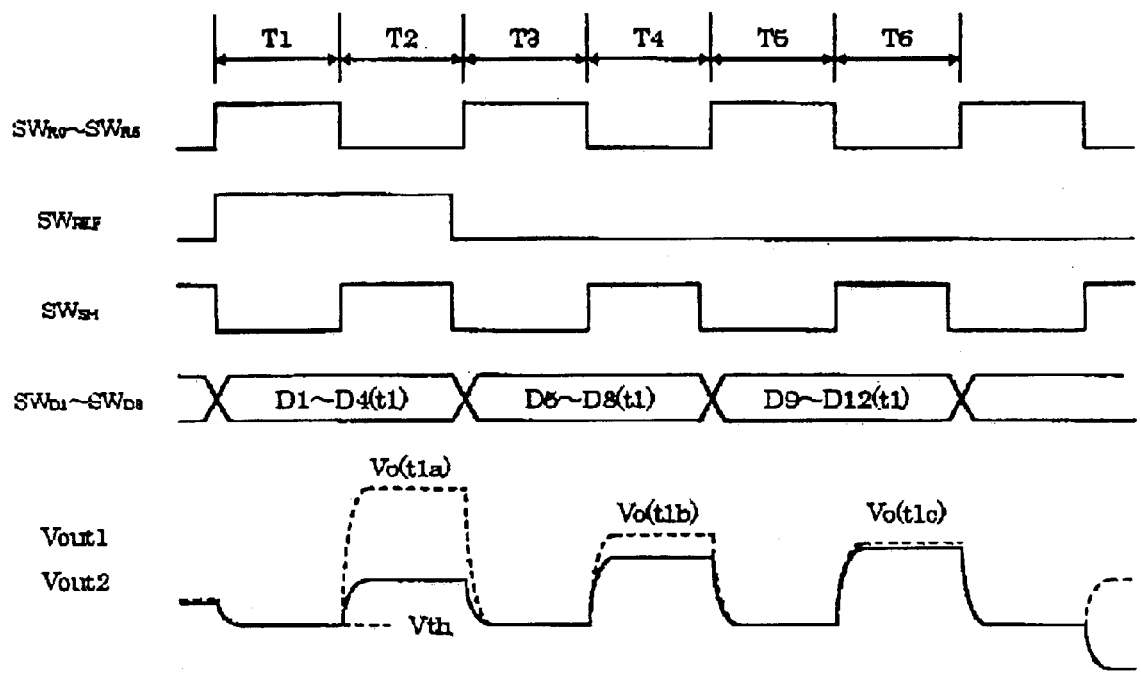
FIG. 12 is a timing diagram to realize the resolution of 12-bit precision by the D/A converter of FIG. 11.

The operation of the circuit of FIG. 11 will be described with reference to a timing chart of FIG. 12. FIG. 12 is a timing chart to obtain 12-bit resolution, in which the reset operation and the output operation are repeated three times. Subscripts "a" and "b" used to distinguish the two systems of DAC1A and DAC1B are omitted from the switch characters shown in the timing chart. The reason is that the switches in the two systems are controlled in the same way. In this timing chart, let it be supposed that, like those of the aforementioned embodiments, "H" of the switches SWR0 to SWR5 and the switch SWREF is a state shown in FIG. 11, and "L" is a state inverting the state of FIG. 11, and the states of the switches SWD1 to SWD4 are fixed by digital data that have been input every 4 bits, and the sample-hold circuits SH1A and SH1B sample the D/A conversion output when a circuit control switch SWSH (not shown) is "H", and is held when the switch is "L". This timing chart is vastly different from that of FIG. 8 or that of FIG. 10 in that digital data to control the switches SWD1 to SWD4 are input every 4 bits from upper bits D1–D4, and the D/A conversion output is performed in such a way as to improve precision gradually.

Periods T1 and T2 represent a first reset operation and a first output operation, respectively. Only in these periods, the switches SWREFa and SWREFb are connected to the side of the reference voltages VT and VB each serving as a base, and, like the operations of the aforementioned embodiments, the reference voltage is given to the independent terminal of the binary-weighted capacitor according to digital data in period T1, and VT is given to the terminating capacitor in DAC1A, whereas VB is given to the terminating capacitor in DAC1B. If digital data given by D1 to D4 is represented as k (k=0–15), output voltages Vo1 and Vo2 arising at output terminals Vout1 and Vout2 in the next period T2 are as follows. These voltage values are held in the sample-hold circuits SH1A and SH1B. In Equations (9) and (10), $\Delta V$ is defined as $\Delta V = VT - VB$.

$$Vo1(t1a) = (k+1)/16 * \Delta V + VB \quad (9)$$

$$Vo2(t1a) = k/16 * \Delta V + VB \quad (10)$$

The reset operation and the output operation are again repeated in the next periods T3 and T4. The switches SWREFa and SWREFb are connected to the sample-hold circuits SH1A and SH1B, and voltage values indicated in (9) and (10) are given as reference voltages when repeated. Therefore, if digital data of D5 to D8 given in these periods is represented as j (j=0–15), each output voltage is expressed as (11) and (12). In Equations (11) and (12), $\Delta V'$ is defined as $\Delta V' = Vo1 (t1a) - Vo2 (t1a) = \Delta V/16$ $$Vo1(t1b) = (j+1)/16 * \Delta V' + (k/16 * \Delta V + VB) \quad (11)$$

$$Vo2(t1b) = j/16 * \Delta V' + (k/16 * \Delta V + VB) \quad (12)$$

Likewise, in periods T5 and T6, a third reset operation and a third output operation are repeated. The reference voltage given to each capacitor becomes equal to the voltage value indicated in (11) and (12) sample-held in period T4 at this time. Therefore, if digital data of D9 to D12 is represented as i (i=0–15), the output voltage is expressed as Equations (13-1) and (14-1). In these equations, $\Delta V''$ is $\Delta V'' = Vo1 (t1b) - Vo2 (t1b) = \Delta V'/16 = \Delta V/256$, and $\Delta V'$ is $\Delta V' = Vo1 (t1a) - Vo2 (t1a) = \Delta V/16$. Therefore, Equations (13-2) and (14-2) are obtained by standardizing the equations by $\Delta V$ and satisfying the relation l=i+16*j+256*k (l=0–4095).

$$Vo1(t1c) = (j+1)/16 * \Delta V'' + i/16 * \Delta V' + k/16 * \Delta V + VB \quad (13\text{-}1)$$

$$= (l+1)/4096 * \Delta V + VB \quad (13\text{-}2)$$

$$Vo2(t1c) = j/16 * \Delta V'' + i/16 * \Delta V' + k/16 * \Delta V + VB \quad (14\text{-}1)$$

$$= l/4096 * \Delta V + VB \quad (14\text{-}2)$$

Thus, from Equations (9), (10), (11), (12), (13-2), and (14-2), it is understood that the resolution of the output voltage rises by repeating the reset operation and the output operation. The appearance of the waveform of the analog output is shown as Vout1 and Vout2 in FIG. 12. As can be understood from the figure in which Vout1 is shown by the broken line, and Vout2 is shown by the solid line, the difference therebetween becomes small whenever the operation is repeated, and a difference in T2 is 1 LSB of 4-bit resolution, a difference in T4 is 1 LSB of 8-bit resolution, and a difference in T6 is 1 LSB of 12-bit resolution. Therefore, it is understood that the resolution of the output rises in accordance with the difference.

Therefore, it is understood that a high-resolution D/A converter with a relatively small circuit size can be realized even by using the structure shown in FIG. 11. The circuit structure of FIG. 11 is characterized in that relative unevenness in the two systems can be restricted to be small by increasing the resolution of a difference voltage with the two systems having the same structure even if there is unevenness or the like in elements (electronics devices), and the circuit structure is unsusceptible to such element unevenness although the circuit size is slightly larger than those of the structures of FIGS. 5, 7, and 9.

Seventh Embodiment

A description of all of the foregoing embodiments has been given on the premise that a 1-input and 1-output type inverting amplifier, such as that shown in FIG. 3, is used as an inverting amplifier. Next, the structure of a fully differential 2-input and 2-output type D/A converter will be shown as a seventh embodiment. This fully differential D/A converter is used as a comparison voltage generating D/A converter for use in, for example, a pipeline type A/D converter that increases resolution by establishing the multistage connection of a small-bit comparison circuit to an amplifier that amplifies a difference voltage between a signal voltage and a comparison voltage, and the fully differential D/A converter is expected to handle noise from a power supply system or a GND system. However, since a voltage scaling type converter that employs a divided voltage of a resistor string has conventionally been used, a fully differential type converter in the strict sense of the term has not been realized. However, a description will be given of the fact that such a fully differential D/A converter can be realized by applying the present invention with reference to FIG. 13 and FIG. 14.

Figure 13:
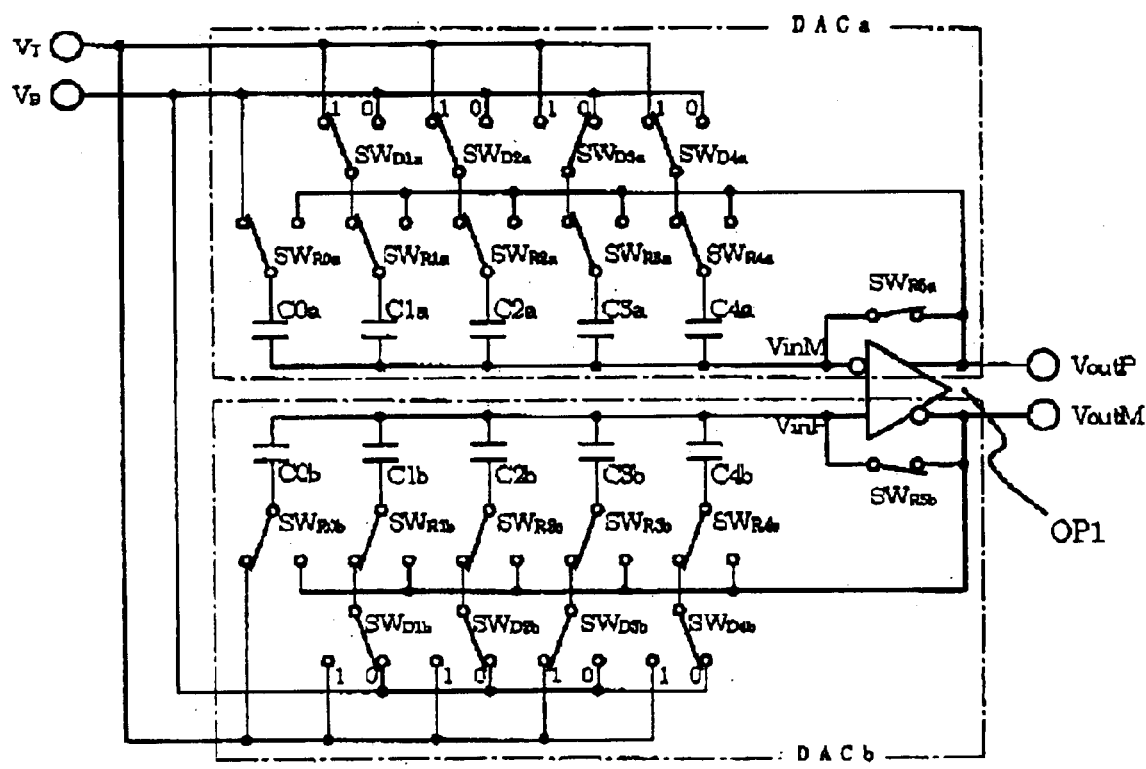
FIG. 13 is a circuit diagram showing a D/A converter of a seventh embodiment of the present invention.

FIG. 13 shows a structure including capacitors, switches, etc., provided to two input/output systems of a 2-input and 2-output fully differential operational amplifier (OP1) in the same way as in FIG. 1. Subscripts "a" and "b" are attached to the constituent elements of the two systems DACa, DACb. Herein, capacitors C1a to C4a and C1b to C4b are binary-weighted capacitors the ratio of the capacitance values of which is 1:2:4:8, and capacitors C0a and C0b are terminating capacitors whose capacitance ratio is 1. One end of each of these capacitors is connected in common to an inversion input terminal VinM and to a noninversion input terminal VinP of the fully differential operational amplifier OP1 in each system. The other end of each of the capacitors is connected independently to switches SWR0a to SWR4a and switches SWR0b to SWR4b in each system. By these switches, the independent terminal side of the capacitors is connected to either of the two of the bottom reference voltage VB and the top reference voltage VT serving as main reference voltages in the reset operation. In the output operation, the capacitors C1a to C4a one end each of which is connected in common to the inversion input terminal VinM are connected to a noninversion output terminal VoutP of the fully differential operational amplifier, and the capacitors C1b to C4b one end each of which is connected in common to the noninversion input terminal VinP is connected to an inversion output terminal VoutM. Further, a feedback switch SWR5a is disposed between the inversion input terminal VinM and the noninversion output terminal VoutP of the fully differential operational amplifier, and a feedback switch SWR5b is disposed between the noninversion input terminal VinP and the inversion output terminal VoutM. In the reset operation, the bottom reference voltage VB of the main reference voltages connected to the independent terminal side of each capacitor is fixedly given to the terminating capacitor C0a, and the top reference voltage VT thereof is fixedly given to the terminating capacitor C0b.

To the binary-weighted capacitors C1a to C4a and C1b to C4b, the voltages are selectively given by data-selecting switches SWD1a to SWD4a and SWD1b to SWD4b controlled on the basis of digital data. Control signals of the data selecting switches that correspond to the two systems DACa, DACb are in a reversed state. For example, SWD1b is "L" if SWD1a is "H".

Since the reversed reference voltage is given to the two systems DACa, DACb in the reset operation as described above, the output voltage values from the two signal output terminals VoutP and VoutM take symmetrical values to (VT+VB)/2, which is an intermediate potential of the two reference voltages, and thereby fully differential output can be obtained. Additionally, since the capacitors are connected to opposite reference voltages, respectively, in the two systems DACa, DACb regardless of the value of the digital data in the reset operation, load capacitors connected to the reference voltages VT and VB are always the same with each other. Therefore, symmetry properties also exist in the input characteristics of the reference voltage.

Figure 14:
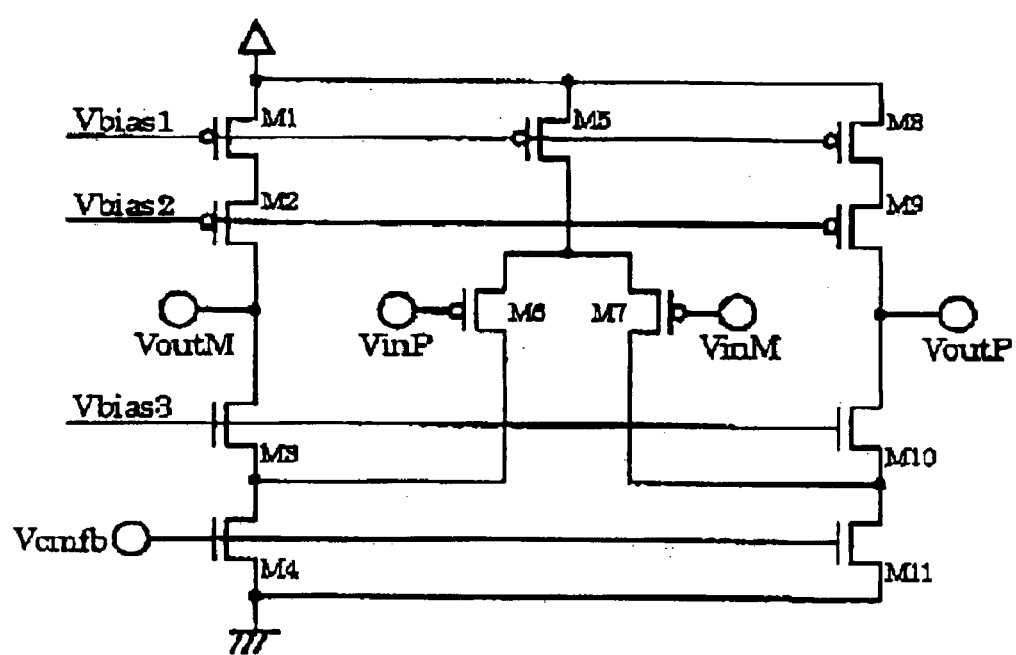
FIG. 14 is a concrete example of the structure of a fully differential operational amplifier used in FIG. 13.

FIG. 14 shows one example of the fully differential operational amplifier used in this fully differential D/A converter. As can be understood from a comparison with FIG. 3, this amplifier is made up of PMOS transistors M1 and M2 and NMOS transistors M3 and M4 that are stacked upright. Further, there are provided a PMOS transistor MS whose gate is connected to Vbias1 and which functions as a constant current source, differentially structured PMOS transistors M6 and M7 whose source is connected to the drain of MS and whose gate is used as the noninversion input terminal VinP or the inversion input terminal VinM of this operational amplifier, in which the drains of M6 and M7 are connected to the drains of the NMOS transistors M4 and M11, respectively, which serve as common-source amplification transistors of the aforementioned two inverting amplifiers, with respect to two inversion output circuits of an inverting amplifier whose output is used as the inversion output terminal VoutM of the operational amplifier and an inverting amplifier made up of PMOS transistors M8 and M9 and NMOS transistors M10 and M11 and whose output is used as the inversion output terminal VoutP of the operational amplifier. Concerning the devices in the two inverting amplifiers, like the inverting amplifier of FIG. 3, the PMOS transistors M1 and M8 to the gate of which the bias voltage Vbias1 is connected function as constant-current source type loads, and the NMOS transistors M3 and M10 having a cascode connection to the transistors M4 and M11 and whose gate is connected to the bias voltage Vbias3, and the PMOS transistors M2 and M9 having a cascode connection to M1 and M8 and whose gate is connected to the bias voltage Vbias2 are provided in order to increase the open loop gain of the inverting amplifier. However, unlike FIG. 3, not an input terminal but a common-mode feedback voltage Vcmfb is connected only to the gate of the NMOS transistors M4 and M11, and thereby the PMOS transistors M6 and M7 connected to the drain terminals of M4 and M11 function as common-source inverting amplifiers. A voltage value that has undergone feedback from the two output voltages is given to the common-mode feedback voltage Vcmfb so that (VoutM+VoutP)/2, which is an average value of the output terminals VoutM and VoutP, can take a determined voltage value.

A description has been given in the above of the circuitry structure of FIG. 13 and the device structure of the fully differential operational amplifier used in FIG. 13. This fully differential operational amplifier is characterized in that two output voltages are symmetry to the intermediate potential used as one operation point, and this amplifier is further characterized as having strength against an external noise because no influence is exerted on the difference voltage of the two outputs even if the operation point of the intermediate potential deviates because of influence of a noise or the like. When the feature of FIG. 13 is seen from such a viewpoint, the following respects can be understood. Since the fully differential operational amplifier of FIG. 13 is in a complete symmetric state in the two input/output systems, it is, of course, strong against an common-mode noise, and, as can be understood from FIG. 13, the capacitors C0a to C4a and C0b to C4b, the switches SWR0a to SWR5a and SWR0b to SWR4b, and the switches SWD1a to SWD4a and SWD1b to SWD4b have complete the same structure in the two systems DACa, DACb, and the loads connected to the input reference voltage terminals VB and VT are exactly the same therein. Therefore, this structure can be expected to be unsusceptible to a common-mode noise.

A fully differential structured pipeline type A/D converter can be constructed by using the D/A converter for the generation of comparison voltages of the pipeline type A/D converter, thus making it possible to achieve the fourth object of the present invention. Additionally, since this structure is essentially equivalent to that of the first embodiment, this structure has, at the same time, two features one of which is the fact that a D/A converter that does not receive influence of an error caused by a parasitic capacitance can be realized with a simple structure and operation, which is the feature of the first embodiment, and the other one of which is the fact that a D/A converter without an offset error can be realized. Additionally, although only the 4-bit structure is shown in FIG. 13, a fully differential structure corresponding to the embodiment of FIG. 5 can be realized by providing another fully differential D/A converter. Additionally, the fully differential structure can be applied also to the embodiments shown in FIGS. 7 and 9, and a fully differential D/A converter, which has a small circuit size but has high resolution, can be realized by applying the structure of this embodiment to the foregoing embodiments shown by single output.

The entire disclosure of Japanese Patent Applications No. 2000-317998filed on Oct. 15, 2001 and No. 2002-107583 filed on April 10, and U.S. patent application Ser. No. 09/982,303 filed on Oct. 17, 2001 including specification, claims, drawings and summary are incorporated herein by reference in their entirety.

What is claimed is:

1. D/A converter including n+1 (n is a natural number) capacitors in total consisting of one terminating capacitor (C0) serving as a unit capacitor and n binary-weighted capacitors (C1–4) that are subjected to binary weighting to the unit capacitor in the ratio of $1:2:4: \ldots :2^{(n-1)}$, and, an inverting amplifier (INV1) for obtaining amplified output, the input terminal of the inverting amplifier being connected to first terminal side of the n+1 capacitors in common, further comprising:

a feedback switching means (SWR5) provided between the input and output of the inverting amplifier (INV1) and being in a closed state on reset operation period (T1) and in an open state on output operation period (T2);

a switching means for terminating operation (SWR0) supplies one of two main reference voltages (VB,VT) to second terminal side of the terminating capacitor (C0) on the reset operation period (T1), and then, makes connection of the second terminal side of the terminating capacitor (C0) to the output of the inverting amplifier (INV1) on the output operation period (T2);

a plurality of switching means for input operation (SWD1–4,SWR1–4) makes selection of one of the two main reference voltages (VB,VT) to be provided for the second terminal side of the n binary-weighted capacitors (C1–4) depending on digital data (D1–4) on the reset operation period (T1), and then, makes connection of the second terminal side of the n binary-weighted capacitors (C1–4) to the output of the inverting amplifier (INV1) on the output operation period (T2).

2. D/A converter including n+1 (n is a natural number) capacitors in total consisting of one terminating capacitor (C0) serving as a unit capacitor and n binary-weighted capacitors (C1–4) that are subjected to binary weighting to the unit capacitor in the ratio of 1:2:4: . . . :$2^{(n-1)}$, and, an inverting amplifier (INV1) for obtaining amplified output, the input terminal of the inverting amplifier being connected to first terminal side of the n+1 capacitors in common;

further comprising:

a feedback switching means (SWR5) provided between the input and output of the inverting amplifier (INV1) and being in a closed state on reset operation period (T1) and in an open state on output operation period (T2);

a switching means for terminating operation (SWR0) supplies one of sub reference voltages (VM) obtainable by voltage dividing of two main reference voltages (VB,VT) to second terminal side of the terminating capacitor (C0) on the reset operation period, and then, makes connection of the second terminal side of the terminating capacitor (C0) to the output of the inverting amplifier (INV1) on the output operation period;

a plurality of switching means for input operation (SWD1–4,SWR1–4) makes selection of one of the two main reference voltages (VB,VT) to be provided for the second terminal side of the n binary-weighted capacitors (C1–4) depending on upper bits of digital data (D1–4) on the reset operation period, and then, makes connection of the second terminal side of the n binary-weighted capacitors (C1–4) to the output of the inverting amplifier (INV1) on the output operation period; and, sub reference voltage supply means (SUB) for selecting one of m–1 (m is a natural number of 2 or greater) sub reference voltage values obtained by dividing equally into m aliquots between the two main reference voltages (VB,VT) as the sub reference voltage (VM) depending on lower bits of the digital data (D5–8).

3. D/A converter set forth in claim 2, said sub reference voltage supply means (SUB) being another D/A converter (DAC2), comprising;

n'+1 (n' is a natural number) capacitors in total consisting of one terminating capacitor (C5) serving as a unit capacitor and n' binary-weighted capacitors (C6–9) that are subjected to binary weighting to the unit capacitor in the ratio of 1:2:4: . . . :$2^{(n'-1)}$;

an inverting amplifier (INV2) for obtaining amplified output, a input terminal of which is connected to first terminal side of the n'+1 capacitors in common;

a feedback switching means (SWR11) provided between the input and output of the inverting amplifier (INV2) and being in a closed state on previous output period (T2) and in an open state on the reset operation period (T1);

a switching means for terminating operation (SWR6) supplies one of two main reference voltages (VB,VT) to second terminal side of the terminating capacitor (C5) on the previous output operation period (T2), and then, makes connection of the second terminal side of the terminating capacitor (C5) to the output of the inverting amplifier (INV2) on the reset operation period (T1); and, a plurality of switching means for input operation (SWD5–8, SWR7–10) makes selection of one of the two main reference voltages (VB,VT) to be provided for the second terminal side of the n' binary-weighted capacitors (C6–9) depending on lower bits of the digital data (D5–8) on the previous output operation period (T2), and then, makes connection of the second terminal side of the n' binary-weighted capacitors (C6–9) to the output of the inverting amplifier (INV2) on the reset operation period (T1);

whereby the inverting amplifier (INV2) outputs the sub reference voltage (VM).

4. D/A converter set forth in claim 2, said sub reference voltage supply means (SUB) comprising;

a switching means (SWT) for providing the terminating capacitor (C0) with one of the main reference voltages (VB,VT) instead of the sub reference voltage (VM) on first reset operation period (T5), and a sample-hold circuit (SH1) holding the output (VM(tla), VM(tlb)) of the inverting amplifier on the previous output operation period (T6,T4) and then, providing the output (VM(tla), VM(tlb)) of the inverting amplifier as the sub reference voltage (VM) on the reset operation period (T3, T1).

5. D/A converter set forth in claim 2, said sub reference voltage supply means (SUB) comprising;

means (SWT') for providing to the second terminal side of the terminating capacitor (C0) with one of the main reference voltages (VB,VT) instead of the sub reference voltage (VM) on first reset operation period (T3), and holding the electric charge of the terminating capacitor (C0) on the reset operation period (T1), the electric charge being obtained by connection of the second terminal side of the terminating capacitor to the output (VM(t1)) of the inverting amplifier on previous output operation period (T4).

6. D/A converter including two D/A converter portions (DAC1A,DAC1B) having same structure with that of D/A converter set forth in claim 1 in parallel, further comprising:

one holding means (SH1A,SWrefa) for holding the output of one of the inverting amplifier (INV1A) on the output operation period (T2) and then supplying it as one of the main reference voltages (VB,VT) on next reset operation period (T3);

the other holding means (SH1B,SWrefb) for holding the output of the other of the inverting amplifier (INV1B) on the output operation period (T2) and then supplying it as the other of the main reference voltages (VB,VT) on next reset operation period (T3);

wherein said one of the main reference voltages (VB,VT) is provided for the second terminal side of the terminating capacitors (C0a) by switching means for terminating operation (SWR0a) on the reset operation period (T1) and the other of the main reference voltages (VB,VT) is provided for the second terminal side of the terminating capacitors (C0b) by the switching means for terminating operation (SwR0b) on the reset operation period (T1), and the plurality of switching means for input operation (SWD1a–4a,SWR1a–4a,SWD1b–4b,SWR1b–4b) makes selection of said one or the other of the two main reference voltages (VB,VT) to be provided for the second terminal side of the n binary-weighted capacitors (C1a–4a,C1b–4b) depending on upper bits of digital data (D1–4) on the reset operation period (T1), and then, makes connection of the second terminal side of the n binary-weighted capacitors (C1a–4a,C1b–4b) to the output of the inverting amplifier (INV1A, INV1B) on the output operation period (T2), after that, the output of the inverting amplifier (INV1A) on the output operation period (T2) is provided for the second terminal side of the terminating capacitor (C0a) by said one holding means (SH1A,SWrefa) and the output of the inverting amplifier (INV1B) on the output operation period (T2) is provided for the second terminal side of the terminating capacitor (C0b) by the other holding means (SH1B,SWrefb) on the next reset operation period (T3), and then, switching means for terminating operation (SWR0a,SWR0b) makes connection of the second terminal side of the terminating capacitors (C0a,C0b) to the outputs of the inverting amplifiers (INV1A,INV1B) on next output operation period (T4), the plurality of switching means for input operation (SWD1a–4a,SWD1b–4b,SWR1b–4b,SWR1b–4b) makes selection of said one or the other of the output of the inverting amplifiers (INV1A,INV1B) on the output operation period (T2) to be provided for the second terminal side of the n binary-weighted capacitors (C1a–4a,C1b–4b) depending on lower bits of digital data (D5–8, or, D9–12) on the next reset operation period (T3), and then, makes connection of the second terminal side of the n binary-weighted capacitors (C1–4) to the outputs of the inverting amplifiers (INV1A,INV1B) on the next output operation period (T4).

7. D/A converter set forth in claims 1–6, wherein the inverting amplifier is fully differential operational amplifier with 2 sets of the input and the output, the inverting amplifier having 2 sets of D/A converter portions (DACa,DACb) corresponding to the 2 sets of the input and output of the inverting amplifier, the D/A converter portions comprising the n+1 capacitors, the feedback switching means, the switching means for terminating operation, and the plurality of switching means for input operation respectively, the two main reference voltages (VB,VT) are provided for the 2 sets of D/A converter portions (DACa,DACb) in opposite way of connections for each other.

* * * * *